(12) United States Patent
Motz (10) Patent No.: US 7,038,447 B2
(45) Date of Patent: May 2, 2006

(54) SENSOR CIRCUIT AND METHOD OF PRODUCING IT

(75) Inventor: Mario Motz, Wernberg (AT)

(73) Assignee: Infineon Technologies AG, Munich (DE)

( * ) Notice: Subject to any disclaimer, the term of this patent is extended or adjusted under 35 U.S.C. 154(b) by 74 days.

(21) Appl. No.: 10/454,193

(22) Filed: Jun. 4, 2003

(65) Prior Publication Data

US 2004/0032246 A1    Feb. 19, 2004

(30) Foreign Application Priority Data

Jun. 4, 2002    (DE) ................. 102 24 747

(51) Int. Cl.
*G01R 33/02*    (2006.01)

(52) U.S. Cl. ............... 324/249; 324/251; 324/252; 327/511

(58) Field of Classification Search ........... 324/224, 324/225, 251, 252, 207.2–21, 249, 207.25, 324/207.24; 327/510, 511, 513, 539, 540, 327/541, 543, 544, 542; 307/209, 511
See application file for complete search history.

(56) References Cited

U.S. PATENT DOCUMENTS

| | | | | |
|---|---|---|---|---|
| 3,798,753 A | * | 3/1974 | Camenzind et al. ......... 438/382 |
| 3,989,959 A | * | 11/1976 | Renirie et al. ................ 327/73 |
| 4,449,081 A | * | 5/1984 | Doemen ...................... 318/254 |
| 4,506,214 A | * | 3/1985 | Lienhard et al. ......... 324/117 R |
| 4,833,406 A | * | 5/1989 | Foster ........................ 324/225 |
| 4,908,527 A | * | 3/1990 | Van Antwerp ............... 327/511 |
| 4,970,411 A | * | 11/1990 | Halg et al. ................... 327/511 |
| 5,260,614 A | | 11/1993 | Theus et al. |
| 5,438,990 A | * | 8/1995 | Wahlstrand et al. ........ 324/260 |
| 5,586,742 A | * | 12/1996 | Carter ......................... 248/545 |
| 6,028,472 A | * | 2/2000 | Nagumo ..................... 327/512 |
| 6,037,763 A | * | 3/2000 | Trontelj ................. 324/117 H |
| 6,696,884 B1 | * | 2/2004 | Seven ......................... 327/540 |
| 2002/0053916 A1 | | 5/2002 | Tanizawa |

FOREIGN PATENT DOCUMENTS

| | | |
|---|---|---|
| DE | 100 08 180 A1 | 1/2001 |
| DE | 101 48 596 A1 | 4/2002 |
| EP | 0 525 235 B1 | 2/1993 |
| EP | 1 164 357 A2 | 12/2001 |
| JP | 1-233315 | 9/1989 |
| JP | 07063577 A | 3/1995 |
| JP | 11-118516 | 4/1999 |

* cited by examiner

*Primary Examiner*—Bot Ledynh
*Assistant Examiner*—Kenneth J. Whittington
(74) *Attorney, Agent, or Firm*—Laurence A. Greenberg; Werner H. Stemer; Ralph E. Locher (57) ABSTRACT

A sensor circuit includes a sensor element, a current source for supplying an operating current for the sensor element and an amplifier circuit for amplifying a sensor voltage produced by the sensor element when applying the operating current, wherein the amplifier circuit has a resistor influencing the amplification of it. The resistor of the amplifier current and the sensor element are formed equally as regards technology so that variations, due to technology, of the sensor sensitivity of the sensor element are counteracted by an amplification factor of the amplifier circuit changing in the opposite way.

19 Claims, 7 Drawing Sheets

SENSOR CIRCUIT AND METHOD OF PRODUCING IT

BACKGROUND OF THE INVENTION

1. Field of the Invention

The present invention relates to a sensor circuit and to a method of producing it and, in particular, to a magnetic sensor circuit having a sensor element the output signal of which depends on an external magnetic field, a current source for providing an operating current for the sensor element and an amplifier circuit for amplifying a sensor voltage produced by the sensor element.

2. Description of the Related Art

Monolithically integrated magnetic sensors, such as, for example Hall sensors, magnetoresistive sensors and so-called giant magnetoresistive sensors, are commercially available and are increasingly utilized, apart from their actual usage as measuring devices for magnetic fields, where a contactless switching is to be effected. Such a field is, for example, revolution counting in the gear or tachometer area of motor vehicles. The Hall elements of such monolithically integrated Hall sensors have sensitivity differences due to technology and temperature.

For compensating sensitivity differences due to technology and temperature, EP 0525235 B1 discloses a Hall sensor which is to enable self-compensation of sensitivity differences without individual equalization measures. For this purpose, the operating current of the Hall element in this Hall sensor is provided by a band gap circuit. The band gap circuit represents a first and a second current source producing a first and a second auxiliary current through a first and a second resistor. The semiconductor zones of the first and the second resistor are produced in essentially the same way as the semiconductor zone of the Hall element. In addition, a first and a second current converter are provided supplying a first and a second partial current having fixed pre-given transforming ratios regarding the first and the second auxiliary current. Finally, adding/subtracting means are provided to produce operating currents for the Hall elements with the desired temperature dependencies by a sum/difference formation of the first and second partial currents.

Further possibilities for compensating sensitivity differences due to technology and temperature of Hall elements are to use several such band gap circuits. In addition, equalizing can for example take place using laser fuses on the wafer on which the Hall sensor circuit is formed or by means of an EEPROM equalization after packaging. Finally, the Hall elements can be measured, wherein such Hall elements not satisfying a predetermined specification are sorted out, which has the consequence of a yield loss.

It is a disadvantage of the bias system of EP0525235B1 described above, which bases on resistors formed like the Hall element that such resistors have a large area and large leakage currents at high temperatures. According to EP 0525235 B1, the currents produced by the band gap circuit are additionally used to determine the switching points of a comparator evaluating the amplified Hall voltage. Thus, there is a high temperature coefficient in both the resistors themselves and the currents determining the switching points.

SUMMARY OF THE INVENTION

It is the object of the present invention to provide a sensor circuit and a method of producing it, having a high precision with a low chip area consumption and low requirements regarding the stability of the production technology.

The present invention is a sensor circuit having:
a sensor element;
a current source for providing an operating current for the sensor element;
an amplifier circuit for amplifying a sensor voltage generated by the sensor element when applying the operating current, the amplifier circuit comprising a resistor influencing the amplification of it, wherein the resistor (Rh6) of the amplifier circuit and the sensor element (10) are formed equally as regards technology so that variations, due to technology, of the sensitivity of the sensor element are counteracted by an amplification factor of the amplifier circuit changing in the opposite way.

The present invention further provides a method of producing a sensor circuit, comprising the following steps:
producing a sensor element;
producing a current source for providing an operating current for the sensor element; and
generating an amplifier circuit for amplifying a sensor voltage generated by the sensor element when applying the operating current, wherein the step of producing the amplifier circuit comprises a step of producing a resistor influencing the amplification of it, and wherein the sensor element and the resistor are produced by common process steps.

The present invention is based on the finding that, when a resistor of the amplifier circuit of the sensor circuit influencing the amplification of it, wherein such a resistor can be referred to as a sense resistor, is set up like the sensor element of the sensor circuit, self-compensation of differences, due to technology, of the sensitivity of the sensor element can take place. Such differences due to technology can, for example, be variations, due to technology, of the doping and the layer thickness of the semiconductor material in which the sensor element is formed.

In preferred embodiments of the present invention, the sensor element is a Hall element, i.e. a Hall plate, on a semiconductor basis and the corresponding resistor of the amplifier circuit is a Hall resistor. In alternative embodiments of the present invention, the sensor element can be a magnetoresistive sensor element on a semiconductor basis, the electrical resistance of which changes corresponding to an external magnetic field applying and the corresponding resistor of the amplifier circuit is a magnetoresistive resistor. Such sensor elements are also referred to as the field plate. In further alternative embodiments of the invention, the sensor element can be a so-called giant magnetoresistive sensor element comprising several layers of metallic and magnetic materials which are, for example, produced on a semiconductor material. Such a giant magnetoresistive sensor element has an increased sensitivity compared to normal magnetoresistive sensor elements. In this latter case, the corresponding resistor of the amplifier circuit is a giant magnetoresistive resistor.

According to the invention, the current source is formed by a band gap circuit providing the bias currents by two bias resistors. According to the invention, the sense resistor is set up like the sensor element so that the bias resistors of the band gap circuit need not be of the same type as the sensor element but can preferably be formed as poly-resistors or poly-layer resistors. Preferably, such resistors being of the same type as the bias resistors used in the band gap circuit, i.e. preferably poly-layer resistors, are used as reverse feedback resistors of the amplifier circuit. By a sum or difference formation of the bias currents from the band gap circuit, an operating current for the sensor element having such a temperature dependency that the temperature dependency of the sensor element is compensated can be provided.

In preferred embodiments of the present invention, a self-compensation of sensitivity differences due to technology and temperature is thus obtained by producing the bias currents in the band gap circuit preferably of poly-resistors, wherein a current based on these bias currents is fed as an operating current into the sensor element, the field plate or the giant magnetoresistive sensor element. The sensor voltage produced is amplified in an amplifier arrangement using, as a sense resistor, a resistor formed, as far as technology is concerned, essentially equally to the sensor element, while poly-resistors are again preferably used as reverse feedback resistors (amplifier resistors). Thus, sensitivity differences due to temperature are compensated by generating the operating current in the band gap circuit while technological variations of this sensor sensitivity, for example by variations of the thickness of the sensor element (for examples of layers of it) or doping changes, are compensated by an amplification factor of the amplifier circuit changing in the opposite way.

In preferred embodiments of the inventive sensor circuit currents are derived from the band gap circuit representing the current source by a sum or difference formation, the currents producing voltages across the reverse feedback resistors of the amplifier circuit or other poly-resistors, wherein the voltages must be overcome by the applying magnetic field and thus the sensor voltage generated in order to have a comparator switch. Thus, the same band gap circuit can be used for a threshold production for magnetic switching points, wherein the advantage lies in the fixed dimensionability of the quantity and the temperature dependency of these voltages serving as switching thresholds. Thus, the magnetic switching points can be set precisely for switching the sensor.

Currents serving for driving a temperature-compensated oscillator preferably being of the relaxation type can also be derived from the same band gap circuit by a sum or difference formation. Such an oscillator is required for a standby mode of low performance sensors, for the chopped operation of very precise Hall sensors and/or for a digital clock generation in the sensor circuit.

Finally, the band gap circuit serving as a current source in the inventive sensor circuit can also be used to derive currents by a sum or difference formation, which produce a reference voltage which in turn serves as a setting value for an internal supply generation. By producing internal supply voltages, external supply voltage disturbances can be suppressed and high external voltages can be set down to low internal voltages.

According to the invention, thus a multiple usage of a single band gap circuit can take place for generating the operating current for the sensor element, for generating bias currents or voltages for a temperature-compensated oscillator, for a threshold production for magnetic switching points as well as for an internal supply voltage production.

The present invention provides a sensor circuit which can do with a very small chip area and has thus a small-area characteristic. In addition, the present invention enables a very high yield by self-compensation and robustness as regards technology variations, i.e. only low requirements are made to the stability of the production technology. By the multiple usage of the only band gap circuit, a drastically reduced chip area results since not three or four band gap circuits must be used, as has been the case before. According to the invention, area-intense and leakage current susceptible Hall resistors in the bias system, as are, for example, used according to EP 0525235 B1, can be dispensed with so that the present invention enables precise output voltages or switching points even at high temperatures. Finally, the present invention provides a high-precision sensor circuit without the necessity of equalizing measures on the wafer or in the package.

Further developments of the present invention are illustrated in the dependant claims.

BRIEF DESCRIPTION OF THE DRAWINGS

Preferred embodiments of the present invention will be detailed subsequently referring to the appended drawings, in which.

DESCRIPTION OF THE PREFERRED EMBODIMENTS

Although preferred embodiments of the present invention will be detailed subsequently referring to Hall sensors, it is obvious that the present invention can be applied to other sensor elements producing an output voltage to be amplified, in particular to other magnetic field sensor elements the output voltage of which depends on a magnetic field applying. The set up of such sensors, such as, for example, Hall sensor elements, magnetoresistive sensor elements and giant magnetoresistive sensor elements, is well known to those skilled in the art and does not need to be explained further.

Figure 1:
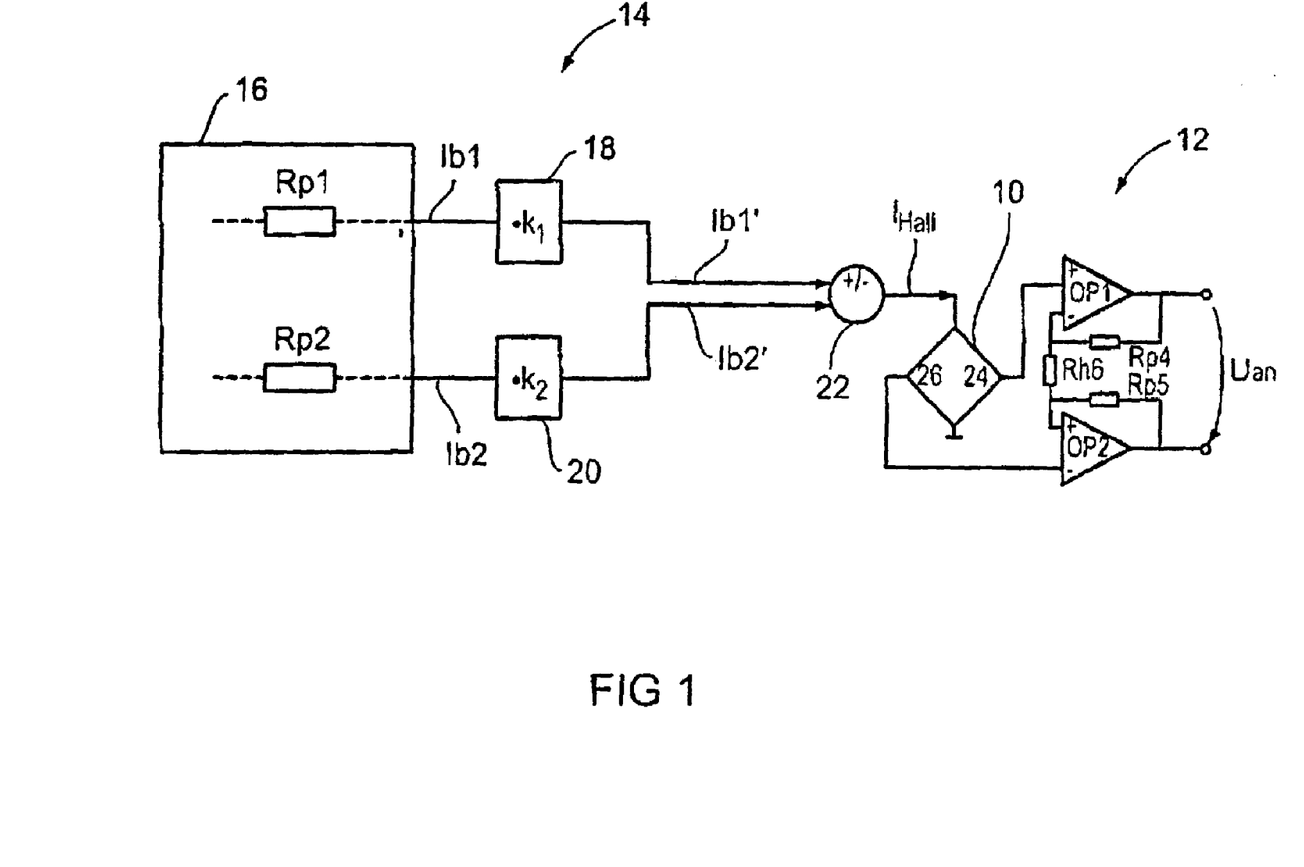
FIG. 1 shows a rough schematic circuit diagram of an embodiment of the invention.

FIG. 1 shows an embodiment of a sensor circuit embodying the present invention. The sensor circuit includes a Hall element or Hall plate 10 the voltage tapping terminals of which are connected to an amplifier circuit 12 and the operating current terminals of which are connected between a current source 14 and ground. The Hall element thus can be formed in a well-known way by means of a doped semiconductor area having certain dimensions.

The current source 14 includes a band gap circuit 16 which can comprise a well-known set up. An embodiment of such a band gap circuit will be detailed subsequently referring to FIG. 4. In any case, a band gap circuit includes two bias resistors Rp1 and Rp2 through which bias currents Ib1 and Ib2, respectively, flow. The bias resistors Rp1 and Rp2 are, according to the invention, preferably formed by poly-resistors. In the band gap circuit, a voltage $V_{PTAT}$ proportional to the absolute temperature, as well as a voltage $V_{CTAT}$ complementary to the absolute temperature are generated in a well-known way. The voltage $V_{PTAT}$ drops across the bias resistor Rp1 so that the bias current Ib1 is proportional to the absolute temperature, while the voltage $VC_{TAT}$ drops across the resistor Rp2 so that the bias current Ib2 is complementary to the absolute temperature. The voltages $V_{PTAT}$ and $V_{CTAT}$ can be made available in a very precise and technology-stable way in a known band gap circuit.

On the basis of the bias currents Ib1 and Ib2, the operating current $I_{Hall}$ for the Hall element 10 is generated by a sum or difference formation. Thus, the sensor circuit has weighting elements 18 and 20 to provide the bias currents Ib1 and Ib2 with factors $k_1$ and $k_2$. In addition, a combining element 22 is provided to add or subtract the weighted bias currents Ib1' and Ib2'. As will be detailed subsequently referring to FIG. 4, the weighting elements 18 and 20 are preferably formed by current mirrors.

By a corresponding selection of the bias resistors Rp1 and Rp2 and a corresponding setting of the weighting factors $k_1$ and $k_2$, defined temperature coefficients of the feeding current $I_{Hall}$ can be obtained by the sum or difference formation carried out in the combining element 22 in order to counteract a temperature dependency of the Hall sensitivity of the Hall element 10.

The amplifier circuit 12 includes two operating amplifiers OP1 and OP2. The non-inverting input of the operating amplifier OP1 is connected to a Hall voltage tap 24 of the Hall element 10, while the inverting input of the operating amplifier OP2 is connected to the other Hall voltage tap 26 of the Hall element 10. The inverting input of the operating amplifier OP1 is connected to the non-inverting input of the operating amplifier OP2 via a Hall resistor Rh6. The output of the operating amplifier OP1 is fed back to the inverting input of it via a poly-resistor Rp4, while the output of the operating amplifier OP2 is fed back to the non-inverting input of the operating amplifier OP2 via a poly-resistor Rp5.

Thus, the amplifier circuit shown in FIG. 1 is formed in the style of a so-called instrumentation amplifier or electrometer amplifier having a sense resistor Rh6 formed by a Hall resistor, and feedback resistors Rp4 and Rp5 at the output of which there is the analog voltage $U_{an}$ representing the amplified Hall voltage.

The amplifier circuit shown in FIG. 1 amplifies the Hall voltage present at the Hall voltage taps of the Hall element 10 in a ratio (Rp4+RP5+RH6)/Rh6. In highly set amplifications, i.e. Rp4 and Rp5>>Rh6, the amplification ratio is simplified to about (Rp4+Rp5)/Rh6.

It will be illustrated subsequently how self-compensation of sensitivity differences of the Hall element 10 due to technology and temperature is obtained in the embodiment shown in FIG. 1.

According to the invention, the Hall resistor Rh6, as far as the layer sequence and the doping profile are concerned, is formed essentially equally to the Hall element 10. This can preferably be obtained by producing the Hall element 10 and the Hall resistor Rh6 by common process steps. More specifically, the common process steps preferable include a step of producing a Hall element semiconductor area and a Hall resistor semiconductor area in a semiconductor layer and a step of doping the two semiconductor areas together to produce the Hall element 10 on the one side and the Hall resistor Rh6 on the other side. Thus, the Hall element 10 and the Hall resistor Rh6 had the same variations, as far as technology is concerned, of for example the thickness and the doping.

If, for example due to technological variations or changes in the technological process, the doping of the Hall plate differs from a pre-given value by 20%, the resistance of the Hall element 10 and of the Hall resistor Rh6 and the current-related Hall sensitivity (in μV/mA/mT) will also decrease by about 20%. As a consequence, the amplification rises above the resistor ratio (Rp4+Rp5)/Rh6 in approximately the same way as the Hall voltage decreases by the lower Hall sensitivity so that the sensitivity difference due to technology is compensated.

With variations due to technology of the resistance of it, the sense resistor of the amplifier circuit, which is a Hall resistor according to the invention, changes the amplification of the amplifier circuit in an inversely proportional way to the change of the sensitivity of the Hall element due to corresponding variations due to technology of it. Variations, due to technology, of the sensitivity of the Hall element are thus counteracted, wherein they are, in the ideal case, compensated completely.

The comparatively small changes of the mobility μ and the scattering factor $r_n$ in the Hall plate due to doping changes can be neglected. In addition, in highly set amplification, the error by Rh6 in the numerator of the amplification factor given above can be neglected since, for example with an amplification of 100 an a doping change of 20%, the amplification is only detuned by 0.2%.

The output useful voltage $U_{Hall}$ between the voltage tap terminals 24 and 26 of the Hall element 10 is thus as follows:

$$U_{Hall} = I_{Hall} \cdot B_z \cdot G_{plate} \cdot \frac{r_n}{q \cdot n \cdot t} \qquad (\text{equ. 1})$$

wherein $I_{Hall}$ is the operating current, i.e. the bias current, of the Hall plate in the plane of the chip surface, $B_z$ is the magnetic field perpendicularly to the plane of the Hall plate, $G_{plate}$ is a geometry factor defined by the form of the Hall plate, $r_n$ is the scattering factor of the Hall sensitivity, q is the elementary charge, n is the doping of the Hall plate and t is the thickness of the Hall plate.

As has been described above, the operating current $I_{Hall}$ of the Hall plate is produced by very stabile but temperature-depending band gap voltages. According to the invention, the operating current is preferably based on layer resistors and thus not on resistors the construction of which corresponds to that of the Hall plate. Advantageously, according to the invention high-resistance poly-resistors can be used for the bias resistors Rp1 and Rp2 in the band gap circuit, which have a number of advantages. They have a low area, a low capacity, a low leakage current and a low temperature coefficient so that high currents can be generated at high temperatures.

As has bee explained above, the bias currents are produced in the band gap circuit by causing a respective voltage drop across the bias resistors, wherein the voltage $V_{PTAT}$ is proportional to the absolute temperature and has a positive temperature coefficient, while the voltage $V_{CTAT}$, which is often a $V_{BE}$ voltage, is complementary to the absolute temperature and has a negative temperature coefficient. Using the weighting factors $k_1$ and $k_2$ which, as will be detailed subsequently, can be implemented preferably as current mirror factors, the operating current $I_{Hall}$ results as follows:

$$I_{Hall} = \frac{k_1 \cdot V_{PTAT}}{Rp1} + \frac{k_2 \cdot 2V_{CTAT}}{Rp2} \qquad (\text{equ. 2})$$

The resistance of a Hall plate and of a resistor formed equally can be calculated from its resistivity and geometry dimensions:

$$R_{Hall} = \rho \cdot \frac{1}{w \cdot t} \qquad (\text{equ. 3})$$

wherein ρ represents the resistivity of the material of a Hall plate or a Hall resistor, l is the length of a Hall plate or of a Hall resistor, w is the width of a Hall plate or of a Hall resistor and t is the thickness of a Hall plate or of a Hall resistor.

The resistivity is also determined by the temperature-depending mobility. The following applies:

$$\rho(T) = \frac{1}{n \cdot q \cdot \mu(T)} \qquad \text{(equ. 4)}$$

By inserting the above equation 4 in equation 3 it becomes evident that the Hall plate resistor and equally formed Hall resistors are influenced by technology-depending variations of the doping and the layer thickness. The following applies:

$$R_{Hall} = \frac{1}{n \cdot q \cdot \mu \cdot w \cdot t} \qquad \text{(equ. 5)}$$

In contrast to the doping n and the layer thickness t, the width w and length l can be set very preciously and constantly by lithography. As has been explained above, the amplification of the Hall voltage $U_{Hall}$ is determined by the resistor ratio of the amplifier circuit 12, wherein in highly set amplifications, there are essentially only poly-resistors in the numerator, while only a Hall resistor is in the denominator:

$$\text{Gain} = \frac{Rp4 + Rp5 + Rh6}{Rh6} \approx \frac{Rp4 + Rp5}{Rh6} \qquad \text{(equ. 6)}$$

The Hall voltage $U_{Hall}$ is amplified via the amplification Gain to the output voltage $U_{an}$:

$$U_{an} = U_{Hall} \cdot \text{Gain} \qquad \text{(equ. 7)}$$

By inserting above equations, the output voltage becomes as follows:

$$U_{an} = \left(\frac{k_1 \cdot V_{PTAT}}{Rp1} + \frac{k_2 \cdot 2V_{CTAT}}{Rp2}\right) \cdot B_z \cdot G_{plate} \cdot \frac{r_n}{q \cdot n \cdot t} \cdot \frac{\frac{Rp4 + Rp5}{l_6}}{n \cdot q \cdot \mu \cdot w_6 \cdot t} \qquad \text{(equ. 8)}$$

wherein $l_6$ is the length of the Hall resistor Rh6 and $w_6$ is the width of the Hall resistor Rh6.

The values, strongly dependent on technology, of the doping n and of the thickness t of the Hall plate and of the Hall resistor Rh6 can be reduced when they are formed equally as regards technology. The following results:

$$U_{an} = \left(\frac{k_1 \cdot V_{PTAT}}{Rp1} + \frac{k_2 \cdot 2V_{CTAT}}{Rp2}\right) \cdot B_z \cdot G_{plate} \cdot r_n \cdot \mu \cdot \frac{Rp4 + Rp5}{G_{Rh6}} \qquad \text{(equ. 9)}$$

wherein $G_{Rh6} \cdot (l_6/w_6)$ is the geometry factor by the form of the Hall resistor Rh6.

The ratio of the poly-resistors Rp1 and Rp2 in the band gap circuit is only dependent on geometry and can be set very precisely and constantly:

$$k_3 = \frac{Rp1}{Rp2} \qquad \text{(equ. 10)}$$

Thus, in the output voltage only parameters remain which can be set precisely and constantly, i.e. constantly as regards temperature and technology:

$$U_{an} = (k_1 \cdot V_{PTAT}(T) + k_2 \cdot k_3 \cdot V_{CTAT}(T)) \cdot B_z \cdot G_{plate} \cdot r_n(T) \cdot \mu(T) \cdot \frac{2 Rp4}{Rp1 \cdot G_{Rh6}} \qquad \text{(equ. 11)}$$

The geometry factors $G_{plate}$ and $G_{Rh6}$ and the current mirror factors $k_1$ and $k_2$ can be set very constantly by lithography. The voltages $V_{PTAT}$ and $V_{CTAT}$ derived from the band gap circuit, due to the band gap principle, also have a very defined temperature dependency. Since the resistors Rp1, Rp2, Rp4 and Rp5 are high-resistance poly-resistors, they have a very low temperature coefficient. As has already been explained, the mobility μ and the scattering factor $r_n$ are only little dependent on the doping.

Thus, by setting the factors $k_1$, $k_2$, and $k_3$ very precisely, temperature dependencies of $r_n(T)$ and $\mu(T)$ of the Hall plate can be compensated to provide a temperature-constant output voltage $U_{an}$. In addition, nearly any defined temperature dependencies of the output voltage can be set essentially independently of technology. Such a setting only takes place by geometry and current mirror factors.

The present invention is not only limited to using band gap voltages $V_{PTAT}$ and $V_{CTAT}$, wherein constant voltages or any mixed voltages of them can be used instead to produce the bias currents through the resistors Rp1 and Rp2.

Figure 2:
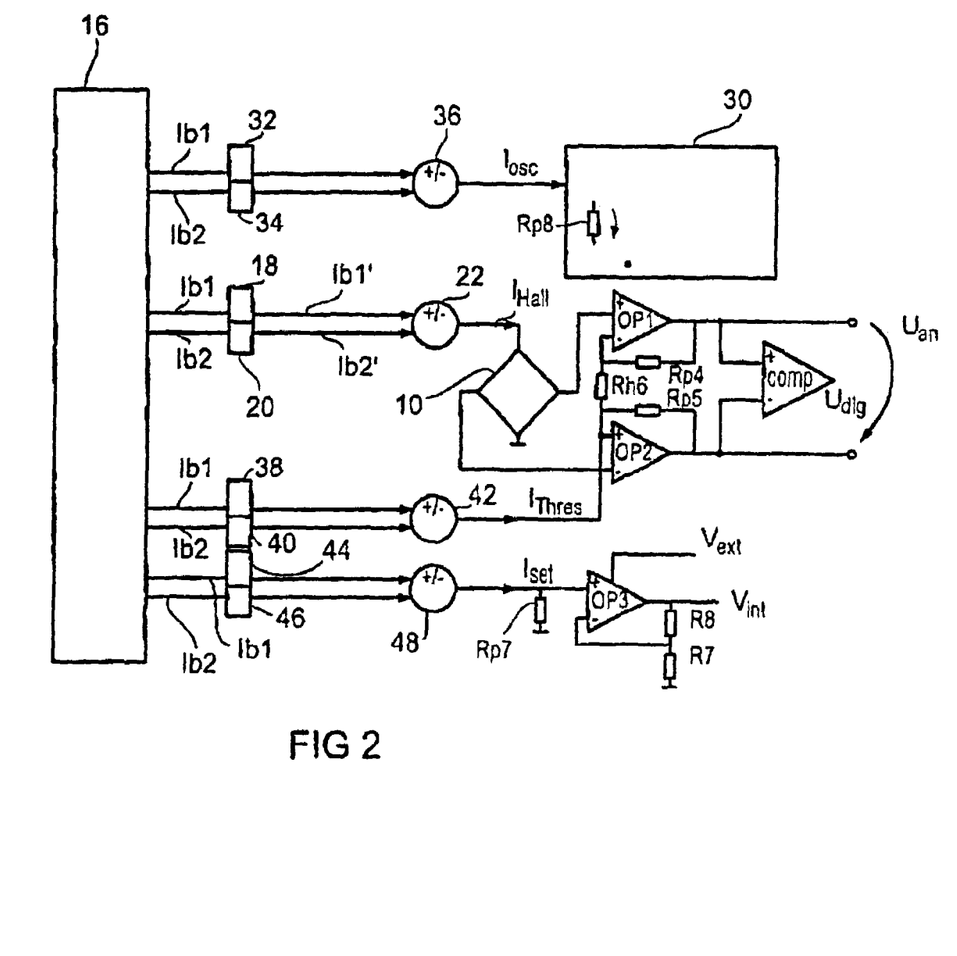
FIG. 2 shows a rough schematic design diagram of an alternative embodiment of the invention.

In FIG. 2 an embodiment of an inventive sensor circuit is shown, in which the band gap circuit used for producing the operating current $I_{Hall}$ is also used to produce a bias current or a bias voltage, respectively, for a temperature-compensated oscillator 30 to realize a threshold production for magnetic switching points and to set an internal supply voltage.

In order to produce a bias current $I_{OSC}$ of the temperature-compensated oscillator 30, the bias currents Ib1 and Ib2 are weighted in weighting elements 32 and 34 and combined in a combining element 36, i.e. an adder or substracter. The currents fed to the combining element 36 in turn are proportional to the bias currents Ib1 and Ib2 so that the oscillator bias current $I_{OSC}$ with a desired temperature dependency can be produced by setting the weighting factors in the weighting elements 32, 34. The oscillator 30 can, in preferred embodiments, be a relaxation oscillator having a poly-resistor Rp8 across which a threshold voltage drops. By the possibility to set the oscillator bias current $I_{OSC}$ with a desired temperature response, temperature-independent oscillator frequencies for a very precise chopper operation of the Hall sensor, for a digital clock production or for a standby operation oscillator clock for low performance sensors can be produced preferably. The oscillator 30 preferably is a relaxation oscillator in which a triangular voltage is produced, wherein the amplitude of the triangular voltage is set by the voltage drop across Rp8 by which the comparator thresholds present in this oscillator type are determined. The integration time on an integration capacity present in this oscillator type is set by the oscillator bias current $I_{OSC}$ according to $t=C \cdot U/I$ so that a temperature-independent oscillator frequency can be set by a suitable selection of the weighting factors.

It is to be mentioned at this point that FIG. 2 is purely schematic as regards the band gap circuit and the weighting elements 32, 34, wherein a possible realization will be detailed subsequently referring to FIG. 3. In this regard, it is to be noted that the weighting elements are preferably formed as current mirrors to provide the bias currents with the respective weighting factors, wherein a transistor of such a current mirror is common for the mentioned usages of the band gap circuit, while the second transistor of the current mirror is associated to the respective usage so that for the respective usages different weighting factors can be produced by setting the ratios between canal length and canal width of the respective transistors correspondingly.

A further usage of the band gap circuit is, as has been mentioned, an additional magnetic threshold production for the switching thresholds of a comparator 100 connected to the output of the amplifier circuit 12 comprising a digital output signal $U_{dig}$. Thus, according to the principle of mixing currents from the band gap circuit 16, threshold voltages also having a technology-independent quantity and a defined temperature coefficient can be produced. With these, very precise magnetic switching points having a defined temperature coefficient can be produced consequently. This usage of the band gap circuit in turn is schematically illustrated in FIG. 2 by weighting elements 38 and 40 as well as a combining element 42, wherein the bias current $I_{Thres}$ obtained in this way for setting the switching thresholds is, in the embodiments shown, fed to the non-inverting input of the operating amplifier OP2. Thus, the bias current $I_{Thres}$ produces a kind of pre-voltage at the output of the amplifier, which is present in a zero magnetic field, in the instrumentation amplifier through the reverse feedback resistors Rp4 and Rp5. This pre-voltage must at first be overcome by a magnetic field applied to cause a switching process of the comparator 100 at the output. This is of advantage since the comparator is not supposed to switch at every zero crossing of a magnetic field applying but, for example, is supposed to switch on at 10 mT and to switch off at 5 mT. Correspondingly, a voltage of 100 mV must, for example, be overcome at the amplifier output to switch on the output, wherein only a smaller, or negative, output voltage of 50 mV must be overcome to switch off the output again.

Finally, the band gap circuit, in the embodiment shown in FIG. 2, further serves to produce an internal supply voltage $V_{int}$, wherein a bias current $I_{set}$, by which a setting value for a regulating amplifier OP3 is produced, is obtained from the same band gap. For this purpose, through weighting elements 44 and 46 and a combining element 48, the defined bias current $I_{set}$ is produced which sets a constant voltage of for example 1.23 V at the non-inverting input of the regulating amplifier OP3 as a setting value across a resistor Rp7. This constant voltage is, in a first approximation, not influenced by layer resistor changes, since the bias resistors Rp1 and Rp2 in the band gap circuit are also of the same type as the poly-layer resistor Rp7. This constant voltage is amplified by the regulating amplifier OP3 reversely fed back through resistors R7 and R8 to an internal constant and temperature-independent supply voltage $V_{int}$ which can, for example, be 2.5 V. This internal supply voltage is constant although the external supply voltage $V_{ext}$ for the regulating amplifier OP3 can vary, such as, for example, between 2.7 V and 28 V. Thus, disturbances occurring in automotive applications of the inventive sensor circuit, for example in the lines of an automobile, can be suppressed.

This is important since the sensor output signals can be very small, in the range of some 10 microvolts, wherein external disturbing voltage peaks can, however, exceed some 10 V.

Figure 3:
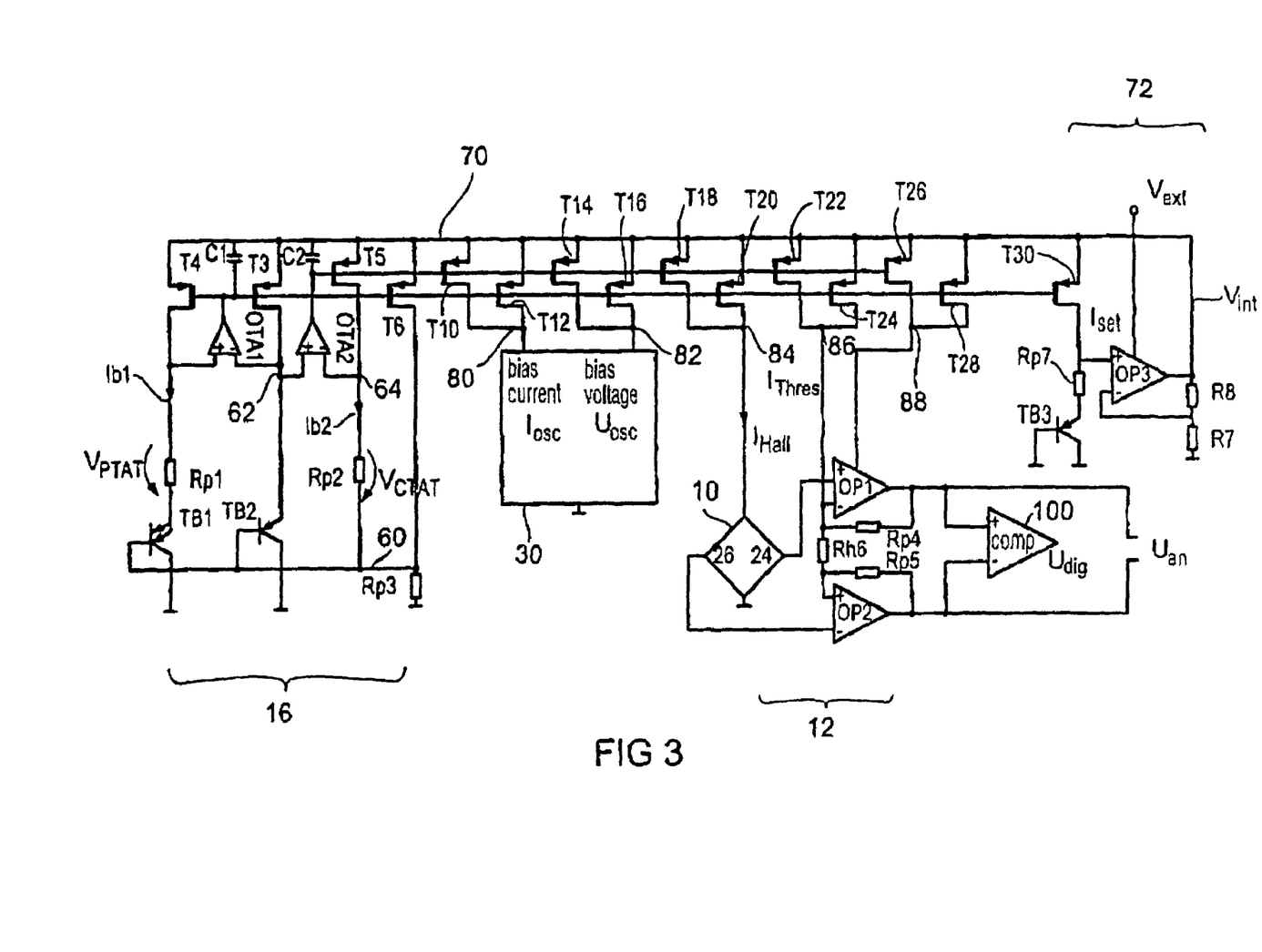
FIG. 3 shows a detailed circuit diagram of the embodiment shown in FIG. 2.

Referring to FIG. 3, a circuit-technological realization of an embodiment of an inventive sensor circuit will be explained subsequently in greater detail. Thus, same or equivalent elements are designated by the same reference numerals as in FIGS. 1 and 2.

The band gap circuit shown in FIG. 3 includes the bias resistors Rp1 and Rp2, a first bipolar transistor TB1, a second bipolar transistor TB2, a first OTA amplifier OTA1 (OTA=operational transconductance amplifier) and a second OTA amplifier OTA2. In addition, field effect transistors T3, T4, T5 and T6, capacitors C1 and C2 and a poly-resistor Rp3 are provided.

The emitter of the bipolar transistor TB1 is connected to a terminal of the poly-resistor Rp1, the base of the transistor TB1 is connected to the base of the transistor TB2 and to a circuit node 60 via which the resistors Rp2 and Rp3 are connected. The emitter of the transistor TB2 is connected to a circuit node 62 which is further connected to the inverting inputs of the two OTA amplifiers OTA1 and OTA2 and to the drain terminal of the transistor T3. The collectors of the two bipolar transistors TB1 and TB2 are at ground. The second terminal of the poly-resistor Rp1 is connected to the non-inverting input of the OTA amplifier OTA1 and the drain terminal of the field effect transistor T4. The poly-resistor Rp2 is connected between the circuit node 60 and a circuit node 64 which is also connected to the non-inverting input of the OTA amplifier OTA2 and the drain terminal of the field effect transistor T6. The poly-resistor Rp3 is connected between the circuit node 60 and ground. In addition, the circuit node 60 is connected to the drain terminal of the field effect transistor T6.

The output of the OTA amplifier OTA1 is connected to the gate terminals of the field effect transistors T3, T4 and T6. The output of the OTA amplifier OTA2 is connected to the gate terminal of the field effect transistor T5. The source terminals of the field effect transistors T3, T4, T5 and T6 are connected to a common supply line 70. In addition, the output of the OTA amplifier OTA1 is connected to the supply line 70 via the capacitor C1 and the output of the OTA amplifier OTA2 is connected to the supply line 70 via the capacitor C2.

The band gap circuit shown in FIG. 3 only represents one embodiment of a plurality of possible band gap circuits and corresponds to well-known band gap circuits as regards its functioning. Thus, the amplifier OTA1 regulates the currents through the transistors T3 and T4 until the difference voltage at its inputs becomes zero. Thus, a voltage $V_{PTAT}$ proportional to the absolute temperature must drop across the poly-resistor Rp1. It forms by the difference of the $V_{BE}$ voltages of the bipolar transistors TB1 and TB2 due to different current intensities in the two transistors. The currents through the transistors are the same but the areas of the transistors differ, as is indicated by the double emitter line of TB1 in FIG. 3. The logarithm of the area ratio is multiplied by $k \cdot T/q = 26$ mV and thus yields the $V_{PTAT}$ voltage over Rp1.

The amplifier OTA2 regulates via the field effect transistor T5 until the $V_{BE}$ voltage of the bipolar transistor TB2 settles across the poly-resistor Rp2. In contrast to the $V_{PTAT}$ voltage dropping across Rp1 and having a positive temperature coefficient, the voltage dropping across Rp2 has a negative temperature coefficient and will subsequently be referred to as $V_{CTAT}$ herein. Thus the currents through Rp1, i.e. Ib1, and through Rp2, i.e. Ib2, have different temperature coefficients.

These bias currents Ib1 and Ib2 are then mirrored out via different MOS current mirrors for the different usages in the different circuits, i.e. the oscillator circuit 30, the amplifier circuit 12 and the supply circuit 72. For this purpose, MOS transistors T10 to T30 are provided, of which a respective one, together with the transistor T4 or T5, forms a current mirror.

The gate electrodes of the transistors T10, T14, T18, T22 and T26 are connected to the gate electrode of the transistor T5. The gate electrodes of the transistors T12, T16, T20, T24, T28 and T30 are connected to the gate electrode of the transistor T4. The respective source electrodes of the transistors T10 to T30 are connected to the common supply line 70, while the respective drain electrodes of the transistors T10 to T28 are connected to one of addition or subtraction nodes 80, 82, 84, 86 and 88, respectively.

The width to length ratios (channel width to channel length) of the MOS transistors T10 to T30 to the width to length ratios of the transistors T4 and T5 can be selected suitably to generate the respective required current mirror factors to obtain the desired current after the respective addition or subtraction nodes. Different but defined temperature coefficients in the mirrored sum streams can be generated by different portions. Thus, for example, constant currents or currents having a positive or negative temperature coefficient can be generated.

To generate the operating current $I_{Hall}$ for the Hall element 10, the width/length ratio of the transistor T20 to the corresponding ratio of the transistor T4 is set to provide the desired weighting factor or current mirror factor $k_1$ for the bias current Ib1. A mirror ratio $k_1$ of 5 can, for example, be obtained when the lengths of the transistors T4 and T20 are the same and the width of the transistor T20 is larger by the factor 5 than the width of the transistor T4. In the same way, the width/length ratio of the transistor T18 to the corresponding ratio of the transistor T5 is set to provide the weighting factor $k_2$ for the bias current Ib2. The correspondingly weighted bias currents are then combined at the summation or subtraction node 84 to generate the operating current $I_{Hall}$.

The transistors T4 and T10 provide a current mirror factor for weighting the bias current Ib1 and the transistors T5 and T12 provide a current mirror factor for weighting the bias current Ib2, wherein the currents weighted in this way are combined at the adding or subtracting node 80 to provide the bias current $I_{OSC}$ for the oscillator 30. In a similar way, the transistors T4 and T14 and T5 and T16, respectively, provide weighted bias currents which are combined at the point 82 to provide a bias voltage $U_{OSC}$ for the oscillator 30.

As has already been mentioned above, a current $I_{Thres}$ for setting the switching point of a comparator 100 connected to the output of the amplifier circuit 12 is provided in the same way through the resistors T22 and T24. Thus, the comparator 100 switches whenever the analog amplified Hall voltage $U_{an}$ exceeds predetermined thresholds so that the digital output signal $U_{dig}$ is present at the output of the comparator 100.

It is also indicated in FIG. 3 that the power supply for the operating amplifiers OP1 and OP2 is also provided through the band gap circuit 16, wherein for reasons of clarity, only one corresponding terminal for the operating amplifier OP1 is shown. Fur this purpose, the transistors T26 and T28 are provided providing respective corresponding mirror current factors with the transistors T4 and T5, wherein the currents flowing through the transistors T26 and T28 are combined at the addition or subtracting node 88.

It is further illustrated in FIG. 3 how, through the transistor T30 providing a current mirror with a corresponding current mirror factor together with the transistor T4, a current $I_{set}$ is generated, by which a constant voltage of a pre-given value, such as, for example, 1.23 V, can be set via the series connection of the resistor Rp7 and transistor TB3. As has been explained, this constant voltage is, in a first approximation, not influenced by layer resistor changes since the bias resistors of the band gap circuit Rp1 and Rp2 are of the same type as the resistor Rp7 across which the constant voltage is set. This constant voltage is amplified to the value of an internal supply voltage, such as, for example, 2.5 V, across the feedback resistors R7 and R8, wherein this internal supply voltage $V_{int}$ is available via the common supply line 70.

The Hall voltage tapped via the Hall voltage tap terminals 24, 26 of the Hall element 10 is flawed with technological variations of the Hall layer resistor and of the poly-bias layer resistors Rp1 and Rp2. As has been explained, this uncertainty in the sensor output voltage is compensated or reversed by forming the sense resistor Rh6 as a Hall resistor and the reverse feedback resistors Rp4 and Rp5 as resistors of the same type as the bias resistors Rp1 and Rp2 (layer resistors). Thus, the technological variation of the resistors, in a first approximation, is not included in the sensor output voltage and the temperature coefficient of the sensor output voltage can be selected arbitrarily. In addition, the switching point of a sensor with a digital switching output can be set exactly since the currents for the threshold production ($I_{Thres}$) are also derived from the band gap circuit.

Figure 4:
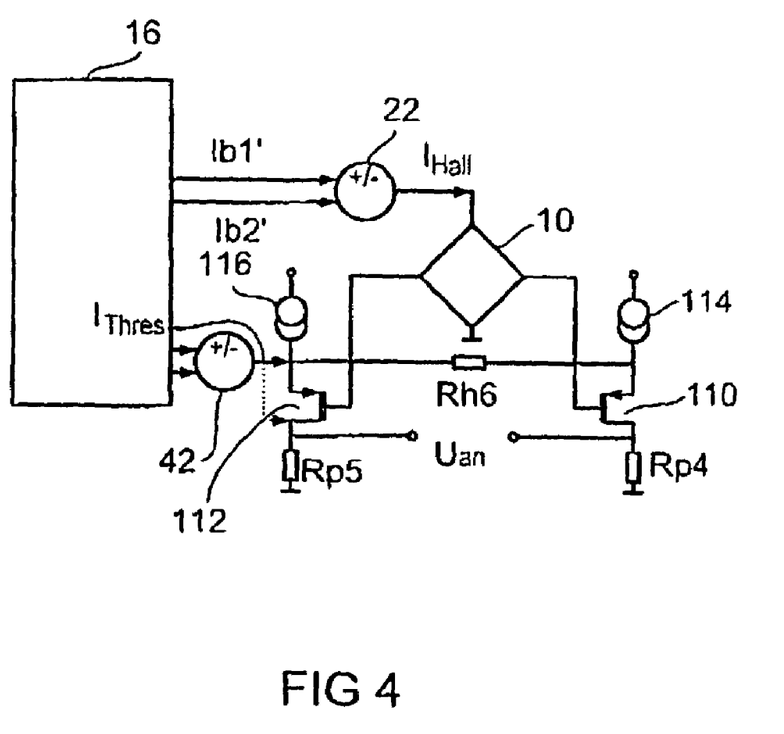
FIGS. 4–6 show schematic circuit diagrams of examples of amplifier circuits used according to the invention.
Figure 5:
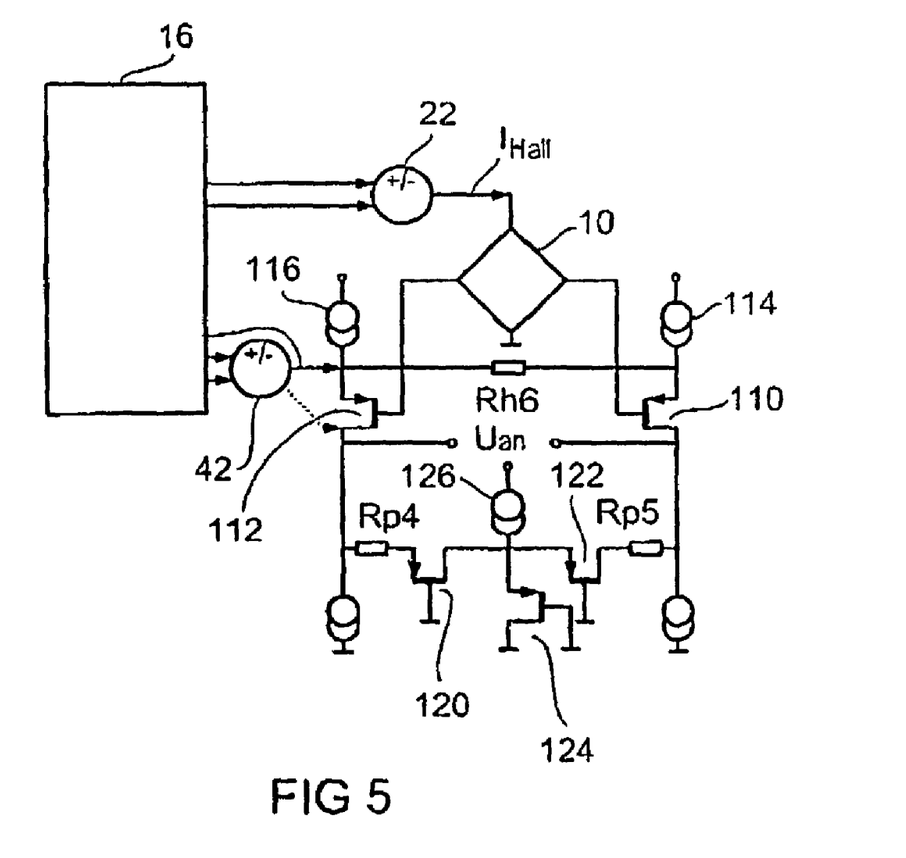
Figure 6:
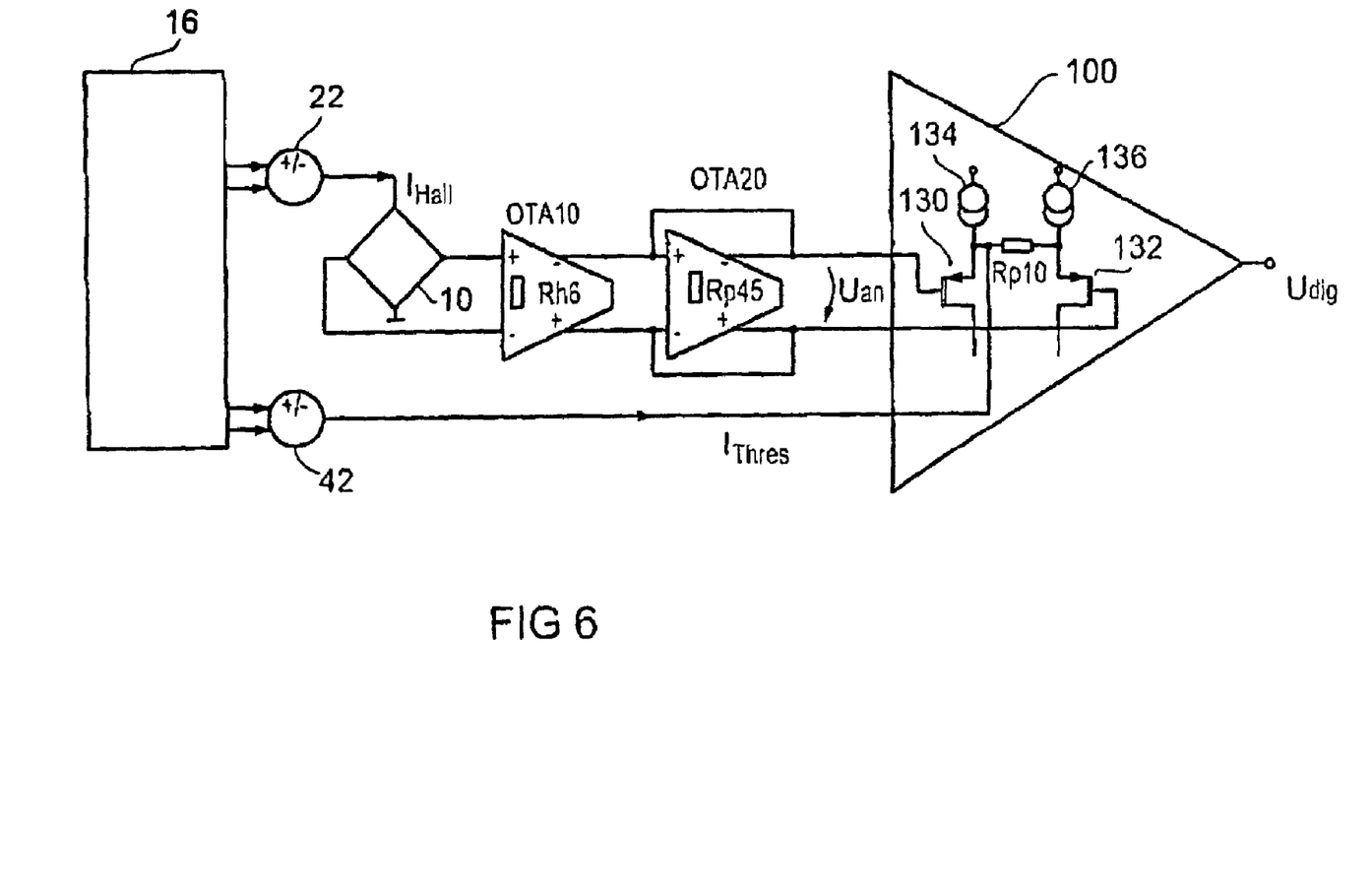

Referring to FIGS. 4 to 6, realization examples of amplifier circuits, as can be used in the inventive sensor circuit, will be discussed subsequently.

FIG. 4 thus shows a very simple OTA amplifier having an amplification ratio of about (Rp4+Rp5)/Rh6. The layer resistors Rp4 and Rp5 and the Hall resistor Rh6 serving as a sense resistor are connected to the corresponding amplifiers which are schematically illustrated by transistors 110 and 112 and current sources 114 and 116 as is shown. According to the amplifier circuit of FIG. 4, the threshold current $I_{Thres}$ in turn is obtained from the band gap circuit 16, wherein, as is indicated, this threshold current can be supplied to the source or the drain of the transistor 112.

In FIG. 5 a somehow more detailed circuit diagram of an amplifier is shown, wherein parasitic influences of the PMOS input transistors 110 and 112 are essentially compensated by correspondingly dimensioned reverse feedback transistors 120 and 122. A transistor 124 connected between the connection point between the reverse feedback transistors 120 and 122 and ground as well as a current source 126 connected between this connecting point and a supply potential, such as, for example, $V_{int}$, serve for a common mode operating point setting of the amplifier.

The inherently strong technology and temperature dependency of the approximate amplification of (Rp4+Rp5)/Rh6 of the circuit of FIG. 5 is reversed again by the band gap currents $I_{Hall}$ fed into the Hall plate. The remaining influence of the input transistors 110 and 112 on the amplification is, as has been indicated, compensated to a great extent by the scaled reverse feedback transistors 120 and 122 and by the usage of different temperature coefficients in the bias currents of the input transistors and reverse feedback transistors connected in series to the amplification resistors.

In FIG. 6, an embodiment of an amplifier circuit for an inventive sensor circuit is shown, wherein an amplification of Rp45/Rh6 is provided by reverse feedback OTA amplifiers OTA10 and OTA20. The amplification here is set by OTA amplifiers, wherein the input circle of these OTA amplifiers is essentially determined by the resistors Rp45 and Rh6, respectively, and not by the steepness of the input transistors themselves. In the amplifier circuit shown in FIG. 6, the reverse feedback is obtained by connecting the output of the amplifier OTA10 to the input of the amplifier OTA20, wherein the output of the amplifier OTA20 is at the same time fed back to its own input.

In the input circle of an OTA amplifier, there is usually a transistor difference pair between the source terminals (or emitter terminals) of which a resistor, i.e. Rh6 and Rp45, respectively, is connected in the inventive amplifier circuit so that the steepness of the OTA amplifier, given in μA/V (=output current/difference input voltage), is essentially determined by the resistor connected therebetween. According to the invention, this degeneration resistor Rh6 influencing the amplification of the amplifier circuit is formed as a Hall resistor so that variations, due to technology, of the Hall sensitivity of the Hall element in turn can be counteracted by an amplification factor of the amplifier circuit changing in the opposite way.

The amplified Hall voltage $U_{an}$ produced in this way is then fed to the inputs of the comparator 10 generating the digital output signal $U_{dig}$.

According to FIG. 6, a threshold $I_{Thres}$ is produced from the bias currents of the band gap circuit 16, this current being supplied to the comparator 100 and serving to set suitable switching thresholds. This technology and temperature-compensated threshold generation by means of the combined band gap currents takes place through a poly-layer resistor Rp10 in the comparator connected between the source terminals of two comparator transistors 130, 132, wherein the source terminals are further fed by a supply current, as is schematically illustrated by current sources 134 and 136. The voltage across the comparator poly-resistor Rp10 generated by the threshold current $I_{Thres}$ compensates the output voltage so that technology-independent magnetic switching points which can have a defined and stable temperature coefficient can be generated.

Figure 7:
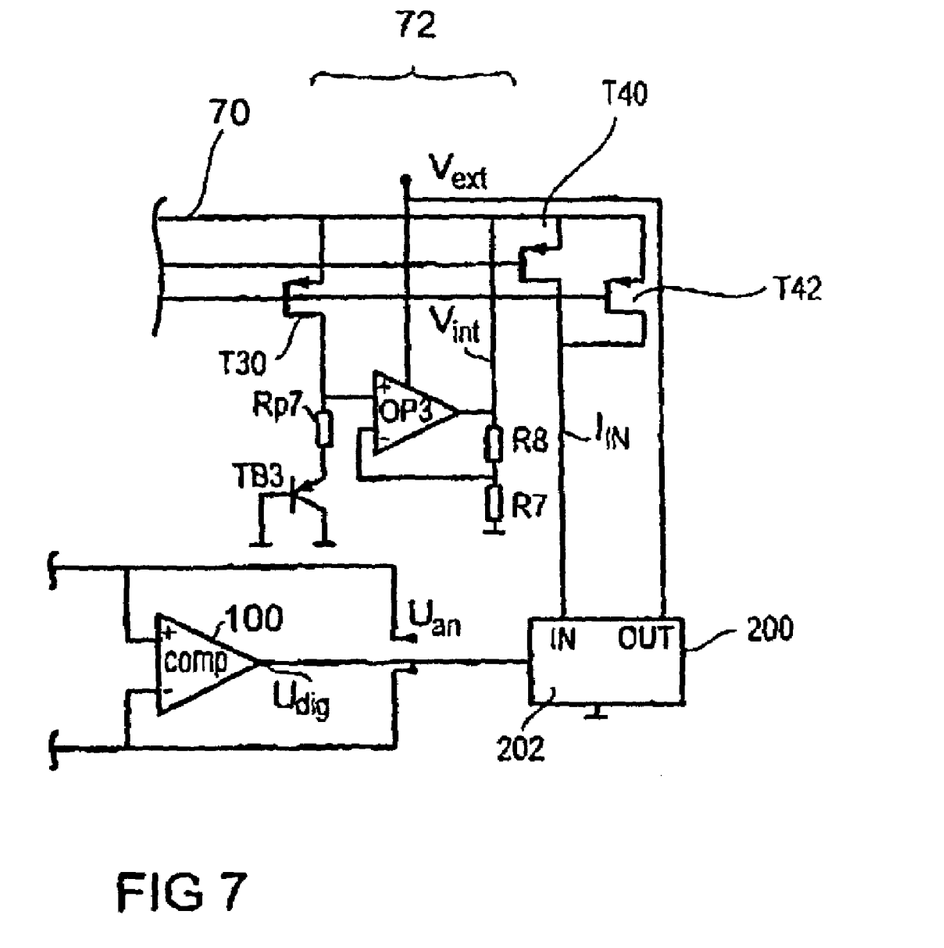
FIG. 7 shows a schematic circuit diagram for illustrating a further usage of the bias current produced by the band gap circuit.

FIG. 7 shows a schematic circuit diagram of the right section of the circuit shown in FIG. 3, wherein the digital output signal $U_{dig}$ is fed to an input 202 of a sensor signal current mirror 200 to switch the current consumption of the current mirror 202 depending on the digital output signal $U_{dig}$ (for example between 7 mA and 14 mA). The input current into the current mirror is obtained via two MOS transistors T40 and T42 from the bias currents made available by the band gap circuit, wherein a current having a defined temperature coefficient in turn can be generated by corresponding width to length ratios of the transistors T40 and T42 to the resistors T4 and T5, respectively. An output OUT of the current mirror 200 is at the external reference potential $V_{ext}$.

In FIG. 7, thus a sensor having a current output is shown, wherein the current mirror, depending on the logic state of the digital output signal $U_{dig}$, draws a high or low current. The circuit shown in FIG. 7 enables a current interface with relatively low production tolerances and with a high stability even at high temperatures. Since bias currents produced by poly-resistors have smaller tolerances than bias currents produced by Hall resistors, a sensor, as is shown in FIG. 7 (in combination with FIG. 3), can be produced without equalizing the current level.

The present invention thus enables a Hall sensor circuit with technology compensation and temperature compensation using only one band gap circuit and using different resistor types, poly-layer resistors on the one side and Hall resistors on the other side. Thus, by the different usage of the two different resistor types in the reverse feedback of an amplifier on the one hand, as a sense resistor in the amplifier on the other hand, a technology compensation is obtained. Using the same band gap circuit, temperature-compensated oscillator clocks and stable internal supply voltages can also be produced, which, in particular in a Hall sensor circuit, provides enormous area savings. In addition, according to the invention no difficulties occur in high temperatures, as is the case when using only one resistor type, i.e. Hall resistor, and when simultaneously using only one band gap according to the prior art, as is described in EP 0525235 B1.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A sensor circuit comprising,
a sensor element;
a current source for supplying an operating current for the sensor element;
an amplifier circuit for amplifying a sensor voltage produced by the sensor element when applying the operating current, the amplifier circuit comprising a resistor influencing the amplification of it,
wherein the resistor of the amplifier circuit and the sensor element are of the same type and formed by the same production technology so that variations, due to the production technology, of the sensor sensitivity of the sensor element are counteracted by an amplification factor of the amplifier circuit changing in the opposite way,
wherein the current source has a band gap circuit including a first and a second bias resistor for providing a first and a second bias current, and
wherein the amplifier circuit has reverse feedback resistors, wherein the bias resistors and the reverse feedback resistors are of the same type and of a type different from the sensor element.

2. The sensor circuit according to claim 1, wherein the sensor element is a Hall element, a magnetoresistive element or a giant magnetoresistive element.

3. The sensor circuit according to claim 1, wherein the sensor element is a Hall element formed by a first doped semiconductor area and the resistor is a Hall resistor formed by a second doped semiconductor area, wherein thickness and doping of the first and second semiconductor areas are subjected to essentially equal technology-depending variations.

4. The sensor circuit according to claim 3, wherein the first and the second semiconductor area, by common production steps, have essentially identical dopings and thicknesses.

5. The sensor circuit according to claim 1, wherein the bias resistors and the reverse feedback resistors are layer resistors of a poly-crystalline semiconductor material.

6. The sensor circuit according to claim 1, comprising first circuit means for combining the first and the second bias currents or weighted versions of the first and the second bias currents to generate the operating current for the sensor element.

7. The sensor circuit according to claim 6, further comprising means for generating weighted versions of the first and the second bias currents, wherein weighting factors of this means are set to counteract a temperature dependency of the output voltage of the sensor element.

8. The sensor circuit according to claim 6, comprising current mirrors for generating the weighted versions of the first and the second bias current.

9. The sensor circuit according to claim 8, wherein the current mirrors have a respective input current and a respective output current and current mirror factors indicating the ratio between output current and input current, wherein the current mirror factors and the ratio between the first and second bias resistors are set to counteract a temperature dependency of the output voltage of the sensor element.

10. The sensor circuit according to claim 1, comprising a comparator, wherein second circuit means for combining the first and the second bias current or weighted versions of the first and the second bias current are provided to produce a threshold bias current setting the switching threshold of the comparator.

11. The sensor circuit according to claim 10, further comprising switching means for switching on and switching off a sensor current produced from weighted versions of the first and the second bias current depending on an output signal of the comparator to change the current consumption of the sensor circuit thereby.

12. The sensor circuit according to claim 1, wherein the amplifier circuit has at least one OTA amplifier, wherein the resistor formed essentially equally to the sensor element represents a degenerating resistor of the OTA amplifier.

13. The sensor circuit according to claim 1, further comprising an oscillator, wherein third circuit means for combining the first and the second bias current or weighted versions of the first and the second bias current are provided to generate at least one of an oscillator bias current and an oscillator bias voltage.

14. The sensor circuit according to claim 1, further comprising circuit means for generating a reference voltage of at least one of the bias currents, wherein the reference voltage serves as a setting value for an internal supply voltage.

15. The sensor circuit according to claim 1, wherein the amplifier circuit has a first and a second operating amplifier, wherein first inputs of each of the first and the second operating amplifier are connected to voltage taps of the sensor element, wherein second inputs of the first and the second operating amplifier are connected to each other via the resistor formed, as regards technology, essentially equally to the sensor element, wherein the output of the first operating amplifier is connected to its second input via a first reverse feedback resistor, wherein the output of the second operating amplifier is connected to its second input via a second reverse feedback resistor, and wherein the amplified sensor voltage can be tapped between the outputs of the first and the second operating amplifier.

16. A method of producing a sensor circuit, comprising the following steps:
producing a sensor element;
producing a current source for providing an operating current for the sensor element, wherein the current source has a band gap circuit including a first and a second bias resistor for providing a first and a second bias current; and
producing an amplifier circuit for amplifying a sensor voltage generated by the sensor element when applying an operating current,
wherein the step of producing the amplifier circuit includes a step of producing a resistor influencing the amplification of it, wherein the amplifier circuit has reverse feedback resistors, wherein the bias resistors and the reverse feedback resistors are of the same type and of a type different from the sensor element, and
wherein the sensor element and the resistor are produced by common process steps.

17. The method according to claim 16, wherein the sensor element is a Hall element, a magnetoresistive element or a giant magnetoresistive element.

18. The method according to claim 16, wherein the sensor element is Hall element, and wherein the common process steps comprise a step of producing a Hall element semiconductor area and a resistor semiconductor area in a semiconductor layer and a step of doping the two semiconductor areas.

19. A sensor circuit comprising,
a sensor element;
a current source for supplying an operating current for the sensor element;
an amplifier circuit for amplifying a sensor voltage produced by the sensor element when applying the operating current, the amplifier circuit including a resistor influencing the amplification of the amplifier circuit,
wherein the resistor of the amplifier circuit and the sensor element are of the same type and formed by the same production technology so that variations, due to the production technology, of the sensor sensitivity of the sensor element are counteracted by an amplification factor of the amplifier circuit changing in the opposite way,
wherein the current source has a band gap circuit including a first and a second bias resistor for providing a first and a second bias current, and
wherein the amplifier circuit has a first and a second operating amplifier, wherein first inputs of each of the first and the second operating amplifier are connected to voltage taps of the sensor element, wherein second inputs of the first and the second operating amplifier are connected to each other via the resistor formed, as regards technology, essentially equally to the sensor element, wherein the output of the first operating amplifier is connected to its second input via a first reverse feedback resistor, wherein the output of the second operating amplifier is connected to its second input via a second reverse feedback resistor, and wherein the amplified sensor voltage can be tapped between the outputs of the first and the second operating amplifier.

* * * * *